(12) United States Patent
Chen et al.

(10) Patent No.: US 12,266,732 B2
(45) Date of Patent: Apr. 1, 2025

(54) SOLAR CELL MODULE AND MANUFACTURING METHOD THEREOF

(71) Applicant: JA SOLAR TECHNOLOGY YANGZHOU CO., LTD., Jiangsu (CN)

(72) Inventors: Hongyue Chen, Jiangsu (CN); Yanfang Zhou, Jiangsu (CN); Xinwei Niu, Jiangsu (CN)

(73) Assignee: JA SOLAR TECHNOLOGY YANGZHOU CO., LTD, Jiangsu (CN)

( * ) Notice: Subject to any disclaimer, the term of this patent is extended or adjusted under 35 U.S.C. 154(b) by 0 days.

(21) Appl. No.: 18/113,724

(22) Filed: Feb. 24, 2023

(65) Prior Publication Data
US 2023/0275169 A1 Aug. 31, 2023

(30) Foreign Application Priority Data
Feb. 25, 2022 (CN) .......................... 202210176695.3

(51) Int. Cl.
*H01L 31/048* (2014.01)
*H01L 31/18* (2006.01)

(52) U.S. Cl.
CPC ...... *H01L 31/0481* (2013.01); *H01L 31/0488* (2013.01); *H01L 31/186* (2013.01); *H01L 31/1876* (2013.01)

(58) Field of Classification Search
CPC .............. H01L 31/048; H01L 31/0481; H01L 31/0488; H01L 31/186; H01L 31/1876
See application file for complete search history.

(56) References Cited

U.S. PATENT DOCUMENTS

2003/0010378 A1* 1/2003 Yoda ................ B32B 17/10055
136/251
2015/0099323 A1 4/2015 Maeda
(Continued)

FOREIGN PATENT DOCUMENTS

| CN | 107400471 A | * 11/2017 | .............. C08J 7/123 |
| CN | 207602592 U | 7/2018 | |
(Continued)

OTHER PUBLICATIONS

CN-111293183-A English machine translation (Year: 2020).*
(Continued)

*Primary Examiner* — Andrew J Golden
(74) *Attorney, Agent, or Firm* — Volpe Koenig

(57) ABSTRACT

Embodiments of the present disclosure provide a solar cell module and a manufacturing method thereof. The manufacturing method includes: providing a solar cell string; arranging welding strips on a back surface of the solar cell string; arranging a first encapsulant material on a back surface of the welding strip, to form a first encapsulant material layer; on the back surface of the solar cell string, arranging a second encapsulant material in a local region corresponding to at least one welding strip, to form a second encapsulant material layer; and laminating to form a laminate member. The manufacturing method can reduce the thickness of the encapsulant film on the back surface of the solar cell, and reduce the distance between the back plate material and the solar cell string, and is capable to fully protect the welding strip.

15 Claims, 2 Drawing Sheets

(56) References Cited

U.S. PATENT DOCUMENTS

| | | | | |
|---|---|---|---|---|
| 2015/0155412 A1* | 6/2015 | Sakuma | ............. | H01L 31/0201 |
| | | | | 136/251 |
| 2015/0249175 A1* | 9/2015 | Bunea | .................. | H01L 31/048 |
| | | | | 438/66 |
| 2020/0274012 A1* | 8/2020 | Cassagne | ............. | H01L 31/048 |
| 2021/0020586 A1* | 1/2021 | Krajewski | ............ | H01L 23/562 |

FOREIGN PATENT DOCUMENTS

| | | | | | |
|---|---|---|---|---|---|
| CN | 111293183 A | * | 6/2020 | ......... | H01L 31/0481 |
| CN | 111635706 A | | 9/2020 | | |
| JP | 2015185695 A | | 10/2015 | | |
| KR | 20140013147 A | * | 2/2014 | | |
| KR | 2020009730 A | * | 1/2020 | ....... | H01L 31/02002 |

OTHER PUBLICATIONS

CN-107400471-A English machine translation (Year: 2017).*
KR-2020009730-A English machine translation (Year: 2020).*
KR-20140013147-A English machine translation (Year: 2014).*

* cited by examiner

SOLAR CELL MODULE AND MANUFACTURING METHOD THEREOF

TECHNICAL FIELD

Embodiments of the present disclosure relate to a solar cell module and a manufacturing method thereof.

BACKGROUND

With continuous development of the industry, a manufacturing ability of crystalline silicon has been constantly improved, and various large-sized silicon wafers have been used in the photovoltaic industry. At the same time, a research on high-efficiency solar cell is also making continuous progress. At present, a market share of a large-sized multi-busbar solar cell is getting higher and higher, and the large-sized multi-busbar solar cell has advantages of high efficiency and low cost. Currently, welding strips commonly used for a solar cell are a circular welding strip, a flat welding strip, etc. For the solar cell, it is necessary to reduce shading by a metal welding strip, thereby improving a light extraction efficiency.

SUMMARY

Embodiments of the present disclosure relate to a solar cell module and a manufacturing method thereof, which can reduce the entire amount of encapsulant material used, reduce the distance between the back plate material and the solar cell string and/or between the front plate material and the solar cell string, which is capable to fully protect the welding strip, so as to better bond the back plate material and the solar cell.

In a first aspect, a manufacturing method of a solar cell module is provided, the manufacturing method of a solar cell module comprises: providing a solar cell string; arranging a plurality of welding strips on a back surface of the solar cell string; arranging a first encapsulant material on a back surface of the welding strip, to form a first encapsulant material layer; on the back surface of the solar cell string on which the first encapsulant material layer is formed, arranging a second encapsulant material in a local region corresponding to at least one welding strip, to form a second encapsulant material layer; and laminating to form a laminate member.

In a second aspect, a solar cell module is provided, the solar cell module is manufactured by using the manufacturing method in the first aspect.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
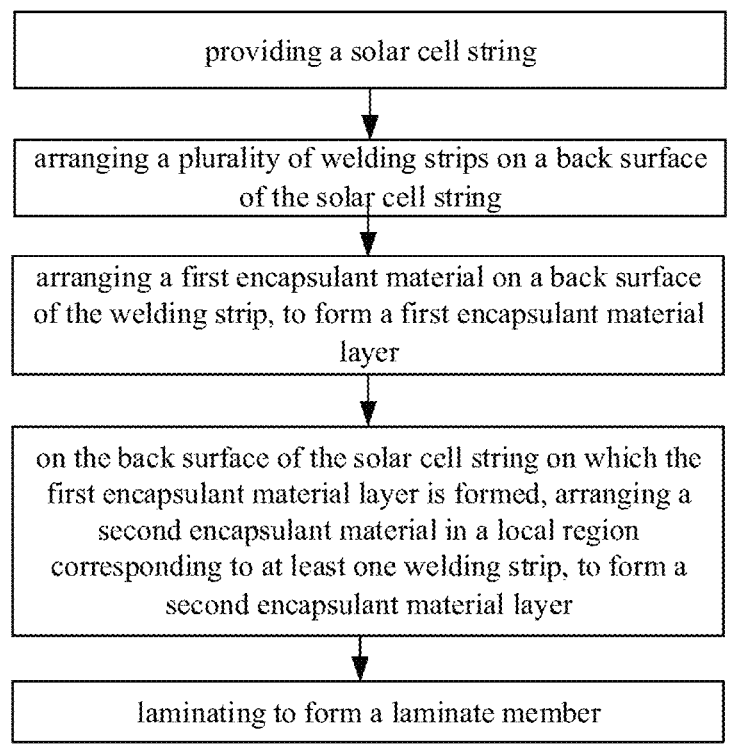
FIG. 1 is a flow chart of an exemplary manufacturing method of a solar cell module according to an embodiment of the present disclosure.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

In a solar cell, a structure of a circular welding strip can reduce shading of a metal welding strip, and can reflect incident light from various angles, so currently mainstream multi-busbar modules on the market all use the circular welding strip. A thickness of a flat welding strip is usually 0.125 mm. When the welding strips have a same cross-sectional area, a diameter of the corresponding circular welding strip is also about 0.35 mm (originally, the diameter of the circular welding strip is 0.4 mm), which is 3 times a diameter of the flat welding strip. In order to ensure a yield of the module in a lamination process and reliability in a later time, a encapsulant film required by the module is also thicker than that of a conventional module, its thickness is usually more than 2 times that of the conventional module, and its weight is more than 1.5 times that of the conventional module. Moreover, even if the encapsulant film is thick, due to the large diameter of the circular welding strip and influence of the lamination process, it cannot be ensured that the circular welding strip can be protected by the encapsulant material and there will be a larger gap between the back plate material and the solar cell.

The closer the back plate material (such as a glass back plate) to the solar cell, the stronger a reflection effect on the light passing through the solar cell; and the larger a distance between the solar cell and the back plate material, the lower the power of the module.

In addition, as the large-sized battery is applied more widely, a size of the module also increases, so an amount of encapsulant material used and a weight of the module also increase, a cost of the module also increases, and difficulty in transportation and installation of the module increases as well. How to ensure the reliability of the module while reducing the weight of the module is a key research issue in the entire industry after the large-sized battery is widely applied.

At present, the following two schemes are adopted in the industry:

1. Reducing the diameter of the circular welding strip

Existing problems: a. at present, the diameter of the circular welding strip can be as small as 0.2 mm temporarily. However, due to reduction of the diameter of the welding strip, if the battery is not changed, a power loss of the module will increase and power will be sacrificed; if it is optimized, the battery needs to be changed, increasing the number of busbars, and increasing a silver paste consumption of the battery and the amount of welding strips used; b. After the welding strip becomes thinner, a yield strength of the welding strip becomes smaller, so it is easy to break during the manufacturing process; the welding strip is soft, and is difficult to stretch, and the welding strip will be bent, so that a precision of series welding becomes worse, the welding is difficult, and a defective rate increases;

2. Using a segmented welding strip. A front surface of the module uses a circular or triangular welding strip, to ensure full use of light, and a back surface thereof uses a flat welding strip. Existing problems: a. The power of the back surface is sacrificed by about 3%; b. It is hard to prepare the segmented welding strip, and because a residual stress at an interface of segments is relatively large, the segmented welding strip is relatively easy to break; in addition, a pattern thereof needs to be fixed, and a length of the segmented welding strip is not easy to change once fixed; c. During a welding process, devices need to be modified to identify the welding strip, and it is also necessary to avoid twisting of the welding strip, which will increase the defective rate of the process.

Therefore, it is necessary to reduce a thickness of the encapsulant material layer, for example, a thickness of the encapsulant material layer on the back surface, reduce an amount of the encapsulant material used, and reduce a distance between the back plate material and the solar cell, without reducing a diameter of a currently used circular welding strip while ensuring a sufficient yield strength of the welding strip and a small battery power loss; moreover, it can be ensured that an encapsulant film in the solar cell module can wrap the back surface of the welding strip away from the solar cell, that is, a surface facing the back plate material, so as to fully protect the welding strip.

Embodiments of the present disclosure provide a solar cell module and a manufacturing method thereof. The manufacturing method includes: providing a solar cell string; arranging a plurality of welding strips on a back surface of the solar cell string; arranging a first encapsulant material on a back surface of the welding strip, to form a first encapsulant material layer; on the back surface of the solar cell string on which the first encapsulant material layer is formed, arranging a second encapsulant material in a local region corresponding to at least one welding strip, to form a second encapsulant material layer; and laminating to form a laminate member. In this way, the encapsulant material layer is formed on the back surface of the solar cell module by using the same or different encapsulant materials through two times of encapsulant, so that the packing material is applied in a local region during a second encapsulant, to reduce the entire amount of encapsulant material used; and at the second encapsulant, the encapsulant material is applied to key regions of the solar cell string, such as, the welding strip, the gap between the solar cells, and the periphery thereof; when laminating is performed before the second encapsulant, obviously the material of the second encapsulant is not subjected to the lamination process and thus can well wrap the welding strip, etc., to protect the welding strip; even if laminating is performed after the second encapsulant, applying the encapsulant material in the local region corresponding to the welding strip can also ensure that the welding strip is well protection, so that in a finally formed solar cell module, the amount of encapsulant material used can be reduced, the distance between the back plate material and the solar cell string can be reduced, and it can be ensured that the encapsulant material remains between the back plate and the welding strip, to wrap the back surface of the welding strip away from the solar cell, that is, the surface facing the back plate material, in order to ensure that a flexible encapsulant material is filled between the welding strip and the back plate material (especially, a glass back plate), to fully protect the welding strip, improve a yield of the solar cell, and avoid defects such as breakage of the solar cell and damage to the solar cell, etc. Moreover, since the encapsulant film is also filled between the welding strip protruding from the surface of the solar cell and the back plate material, there is encapsulant film everywhere between the back plate material and the solar cell, and the back plate material can be firmly attached to the solar cell, and thus, the encapsulant material can connect the front plate material, the solar cell string and the back plate material of the module as a whole. In this way, without reducing the diameter of the currently used circular welding strip while ensuring the sufficient yield strength of the welding strip and the small battery power loss, the distance between the back plate material and the solar cell is reduced, that is, the thickness of the encapsulant material layer on the back surface is reduced; and it can be ensured that the encapsulant film in the solar cell module can wrap the back surface of the welding strip away from the solar cell, that is, the surface facing the back plate material, so as to fully protect the welding strip.

Moreover, for the other welding strips other than the circular welding strip, as well as the busbars, by using the encapsulant material applying process twice in the present disclosure, an amount of the encapsulant material used can be reduced, a distance between the back plate material and the solar cell string can be reduced, a bonding strength of the back plate material to the solar cell string and the front plate material can be improved, the welding strip is fully protected and stability and performance of the solar cell module are improved.

Hereinafter, the solar cell module and a manufacturing method thereof according to the embodiments of the present disclosure will be exemplarily described below with reference to the accompanying drawings.

FIG. 1 shows an exemplary flow chart of a manufacturing method of a solar cell module according to an embodiment of the present disclosure. As shown in FIG. 1, the manufacturing method of a solar cell module includes: providing a solar cell string; arranging a plurality of welding strips on a back surface of the solar cell string; arranging a first encapsulant material on a back surface of the welding strip, to form a first encapsulant material layer; on the back surface of the solar cell string on which the first encapsulant material layer is formed, arranging a second encapsulant material in a local region corresponding to at least one welding strip, to form a second encapsulant material layer; and laminating to form a laminate member.

For example, arranging a second encapsulant material in a local region corresponding to at least one welding strip may be arranging the second encapsulant material corresponding to one, two or all of the plurality of welding strips, which is not limited in the embodiments of the present disclosure. Arranging in the local region corresponding to at least one welding strip may be that an orthogonal projection of the local region on a surface where the solar cell strip is located overlaps at least partially an orthogonal projection of the welding strip, for example, it may be that the orthogonal projection of the local region overlap completely the orthogonal projection of the welding strip, the orthogonal projection of the welding strip falls within a range of the orthogonal projection of the local region, or the orthogonal projection of the local region overlaps partially the orthogonal projection of the welding strip, which is not limited in the embodiments of the present disclosure, and may be selected by those skilled in the art as required. However, in whichever case, it is capable to reduce the thickness of the encapsulant material film while ensuring that the encapsulant film can wrap the back surface of the welding strip away from the solar cell after lamination, that is, the surface facing the back plate material, to fully protect the welding strip.

For example, the second encapsulant material may be directly applied on the back plate material to support, bond and seal the first encapsulant layer. The second encapsulant process requires removal of air between the back plate material and the solar cell string. A corresponding method may be selected according to the back plate material, which may be evacuated or flushed into a protective gas for exchange.

For example, when the encapsulant material arranged in the local region completely covers the welding strip, for example, when the orthogonal projection of the welding strip falls completely within the range of the orthogonal projection of the local region, the welding strip can be completely wrapped by the encapsulant material film, so that the welding strip can be well protected from being damaged. There is no region where the welding strip directly contacts the back plate material between the back plate material and the solar cell, a encapsulant material film is completely arranged therebetween, and the two are well bonded, thereby further improving the performance of the solar cell module.

For example, on the back surface of the solar cell string on which the first encapsulant material layer is formed, arranging a second encapsulant material in a local region corresponding to at least one welding strip, may include: applying the second encapsulant material directly in the local region, to form the second encapsulant material layer.

For example, before applying the second encapsulant material directly in the local region, to form the second encapsulant material layer, the manufacturing method may further include: arranging a flexible isolating material on the first encapsulant material layer; after arranging the flexible isolating material, performing a step of: laminating to form a laminate member; and removing the flexible isolating material.

For example, the flexible isolating material may include a material that is not adhered to the first encapsulant material and can be separated from the first encapsulant material, such as tetrafluorocloth or release paper.

For example, in an embodiment of the present disclosure, after removing the flexible isolating material, the manufacturing method may further include: inspecting and testing the obtained laminate member. If it is found after the test that the laminate member has no electrical connection, etc., the next step will be carried out. The inspecting may be checking whether the welding strip is completely covered, etc. If it is found during inspecting that the welding strip is not completely covered, in the subsequent step of applying the second encapsulant material in the local region, in addition to applying the second encapsulant material in the other region of the welding strip, it may also to apply the encapsulant material especially to a region not covered by the encapsulant material found during inspecting, to ensure that the welding strip is completely covered and avoid a case where the welding strip directly contacts the front plate material and back plate material.

Alternatively, after arranging the flexible isolating material and before removing the flexible isolating material, the manufacturing method may further include: inspecting and testing a component laid with the flexible isolating material.

In this example, since there is no subsequent lamination process after the second encapsulant material is applied, it can be well ensured that the welding strip is fully wrapped; and since there is no subsequent lamination process, the encapsulant material is applied in the local region, which, compared to a case where there is a subsequent lamination process, may relatively reduce the amount of encapsulant material applied, and therefore, can further reduce the amount of encapsulant material used.

For example, after applying the second encapsulant material directly in the local region, to form the second encapsulant material layer, the manufacturing method may further include: covering the back surface of the solar cell string with the back plate material in a weak reactive gas atmosphere and curing the second encapsulant material, wherein, the weak reactive gas is a gas whose activity is weaker than activity of air.

For example, curing the second encapsulant material may adopt light curing, thermal curing, chemical curing, and the like.

For example, in this example, the first encapsulant material may be EVA/POE/EVA co-extruded material, and the second encapsulant material may be EVA.

For example, applying the second encapsulant material directly in the local region, to form the second encapsulant material layer, may include: applying the second encapsulant material (such as EVA material) directly over the at least one welding strip using a hot melting gun; or applying a strip-shaped second encapsulant material (such as EVA material spacer) over the at least one welding strip.

For example, the weak reactive gas may be an inert gas such as nitrogen, helium, or argon.

For example, covering the back surface of the solar cell string with the back plate material in a weak reactive gas atmosphere, may include: covering the back plate material in a low-humidity and high-concentration nitrogen box; or purging with low-humidity and high-concentration nitrogen while covering by using the back plate material. In this way, it is avoided that the gas with high activity has an adverse effect on a performance of the film in the solar cell module, for example, an adverse effect on a performance of the second encapsulant material, thereby further improving the performance and stability of the solar cell module.

For example, a humidity of the nitrogen is 100 ppm or less, and a concentration of the nitrogen is 98% or more.

For example, on the back surface of the solar cell string on which the first encapsulant material layer is formed, arranging a second encapsulant material in a local region corresponding to at least one welding strip, may include: arranging the second encapsulant material in a region corresponding to the at least one welding strip on a surface of a back plate material; and arranging the back plate material on the first encapsulant material layer, wherein, the second encapsulant material faces the first encapsulant material layer, and the second encapsulant material corresponds to the at least one welding strip, wherein, the laminating to form a laminate member is performed after arranging the back plate material on the first encapsulant material layer.

For example, arranging the second encapsulant material in a region corresponding to the at least one welding strip on the surface of a back plate material, may include: applying the second encapsulant material in the region corresponding to the at least one welding strip on the surface of the back plate material using a hot melting gun; or applying a strip-shaped second encapsulant material in the region corresponding to the at least one welding strip on the surface of the back plate material.

For example, when a process of applying the encapsulant material twice is performed on a front surface of the solar cell string, the manufacturing method may include: arranging the second encapsulant material in a region corresponding to the at least one welding strip on a surface of the front plate material, and then arranging the front plate material on the first encapsulant material layer on the front surface of the solar cell string. For other information, reference may be made to the process of applying the encapsulant material twice on the back surface of the solar cell string, which will not be described here for brevity.

For example, the solar cell string includes a plurality of solar cells. At a same time of, on the back surface of the solar cell string on which the first encapsulant material layer is formed, arranging a second encapsulant material in a local region corresponding to at least one welding strip, the manufacturing method may further include: arranging the second encapsulant material on the back surface of the solar cell string and in a region corresponding to a gap between the solar cells and/or a periphery of the solar cell string.

For arranging the second encapsulant material in a gap between the solar cells and/or a periphery of the solar cell string, previous examples may be referred to, which will not be repeated here.

By further applying the second encapsulant material in a gap between the solar cells and/or a periphery of the solar cell string, the bonding strength between the front plate, the back plate and the solar cells can be further improved, thereby improving the performance and stability of the solar cell module.

For example, the manufacturing method of the solar cell module may further include: arranging a third encapsulant material and a front plate material on a front surface of the solar cell string; arranging a desiccant in a periphery of the laminate member; applying a sealant in a periphery of the desiccant; and installing a frame, to form the solar cell module.

For example, the third encapsulant material may be the same as the first encapsulant material and/or the second encapsulant material. For details, please refer to the following description.

For example, after arranging a first encapsulant material on a back surface of the welding strip, to form a first encapsulant material layer, the manufacturing method may further include: arranging a first layer of sealing material in a periphery of the first encapsulant material layer. For example, the first layer of sealing material is arranged between the front plate material and the back plate material and in the periphery of the first encapsulant material layer.

For example, in an embodiment of the present disclosure, a thickness of the first encapsulant material layer may be at least 0.2 mm. For the second encapsulant material layer, if a flexible isolating material is used and then laminated, that is, the second encapsulant material is not subjected to the lamination process, then the second layer of encapsulant material may be relatively thin; if the second encapsulant material is subjected to the lamination process, then the second layer of encapsulant material may be relatively thick, and finally a thickness of the second layer of encapsulant material after curing may be more than 0.1 mm, that is, a distance between the welding strip and the back plate material may be more than 0.1 mm, and a total thickness of the two encapsulant material layers may be more than 0.3 mm. For example, arranging a desiccant in a periphery of the laminate member may be arranging a desiccant between the front plate material and the back plate material and in a periphery of the first layer of sealing material.

For example, applying a sealant in a periphery of the desiccant may be applying the sealant on an outer side of the front plate material and the back plate material and in the periphery of the desiccant, so as to perform double-layer sealing on the solar cell module. In addition, a desiccant is added between the double-layer sealed, thereby further preventing water vapor from infiltrating from around the module to damage the solar cell module, and improving the stability and performance of the solar cell module.

For example, the first encapsulant material may be a single encapsulant material, or a composite encapsulant material with other functions such as improving adhesive performance or blocking water vapor.

For example, in an embodiment of the present disclosure, the first encapsulant material may be different from the second encapsulant material. For example, the first encapsulant material may include one or more of ethylene-vinyl acetate copolymer (EVA), polyolefin elastomer (POE) and polyvinyl butyral (PVB); and the second encapsulant material may include high reflectivity silicone, or one or more of ethylene-vinyl acetate copolymer (EVA), polyolefin elastomer (POE) and polyvinyl butyral (PVB).

For example, in an embodiment of the present disclosure, the first encapsulant material may be the same as the second encapsulant material. For example, the first encapsulant material and the second encapsulant material may include one or more of ethylene-vinyl acetate copolymer (EVA), polyolefin elastomer (POE) and polyvinyl butyral (PVB).

For example, the first encapsulant material and/or the second encapsulant material may be ethylene-vinyl acetate copolymer (EVA), polyolefin elastomer (POE) or polyvinyl butyral (PVB), or may also be a mixture of any two of the three or a mixture of the three.

For example, the polyolefin elastomer may be one or more of copolymers of ethylene and butene, pentene, hexene or octene. When the first encapsulant material and/or the second encapsulant material is ethylene-vinyl acetate copolymer (EVA), EVA materials with different vinyl acetate (VA) contents may be used. When the encapsulant material is polyolefin elastomer, copolymers of ethylene and butene, pentene, hexene or octene or copolymers of ethylene and butene, pentene, hexene or octene with different ethylene contents, a mixture of two of EVA, POE and PVB with different corresponding contents, or a mixture of the three with different contents, may be used. When the encapsulant material film includes encapsulant materials with the same component or composition but with different contents, they may be regarded as different encapsulant materials. For example, when the encapsulant material is ethylene-vinyl acetate copolymer, when the components are the same but the VA content is different, it may be considered as a different encapsulant material. When the encapsulant material is a mixture of polymer materials, when the composition is the same but the content is different, for example, when the encapsulant material includes a mixture of EVA and POE, if the content of EVA is different, it may be considered as a different encapsulant material. Only these two examples are given, and those skilled in the art may deduce other cases, so details will not be described here.

For example, the encapsulant material may include a same polymer material or a same mixture of polymer materials, that is, the first encapsulant material and the second encapsulant material may include the same polymer material, that is, the polymer material with same composition and content or the same mixture of polymer materials, that is, a mixture of polymer materials with the same composition and content; or, the first encapsulant material and the second encapsulant material may be polymer materials with the same composition and different contents; or, the first encapsulant material and the second encapsulant material include a mixture of polymer materials, and the mixtures of the first encapsulant material and the second encapsulant material may have the same composition but different content of at least one composition, or different composition and content, which will not be listed here.

For example, the first encapsulant material and the second encapsulant material may be ethylene-vinyl acetate copolymer (EVA), polyolefin elastomer (POE), polyvinyl butyral ester (PVB), a mixture of EVA and POE, a mixture of EVA and PVB, a mixture of POE and PVB, or a mixture of the three, but the components or composition of the encapsulant material in all regions are the same and the content is the same, for example, EVA with a same VA content, a mixture of EVA and POE with same EVA and same POE as well as same EVA and POE content, etc., which will not be listed here.

For example, the first encapsulant material and/or the second encapsulant material may include a co-extruded material (EPE) of ethylene-vinyl acetate copolymer, polyolefin elastomer, and ethylene-vinyl acetate copolymer. The encapsulant material film consists of three layers, that is, it has POE sandwiched between two layers of EVA and is formed by a co-extrusion machine, and a main purpose of adding POE therebetween is to reduce a Potential Induced Degradation (PID) phenomenon of the module. It should be clear to those skilled in the art that the thickness of each of the three layers may be changed according to types of the solar cell and the module, for example, a bulk density of the encapsulant material film formed by the three-layer co-extruded material may be 480 g/m$^2$, wherein a bulk density of POE therebetween may be 150 g/m$^2$. At present, the bulk density is usually used to control the thickness.

For example, the first encapsulant material may be EPE co-extruded material, and the second encapsulant material may be EVA material.

For example, in the manufacturing method of a solar cell module according to an embodiment of the present disclosure, the step of laminating to form a laminate member may include: laminating in a laminator, wherein, the lamination temperature is 145° C., the lamination process may be performed with a lamination vacuum degree less than 0.5 mbar, and the lamination time is 10 minutes.

For example, the laminating to form a laminate member may include: performing a stepwise lamination in the laminator, to form the laminate member, wherein, the lamination temperature is 145° C., the lamination process may be performed with a lamination vacuum degree less than 0.5 mbar, and the lamination time is 10 minutes. By performing the stepwise lamination to appropriately reduce the lamination pressure, a hidden crack rate of the solar cell module can be reduced.

For example, the performing a stepwise lamination in the laminator, to form the laminate member, include: performing a first lamination under a pressure of 0 to 300 mbar, a lamination time of the first lamination being 1 to 2 minutes; and performing a second lamination under a pressure of 300 to 1000 mbar, a lamination time of the second lamination being 8 to 9 minutes.

Alternatively, the stepwise lamination may also include three steps of lamination, and the lamination time of each step of lamination may be adjusted according to actual conditions. Generally, the lamination time of the last step of lamination is relatively long.

Hereinafter, several examples of the manufacturing method of the solar cell module according to the embodiments of the present disclosure are given below with reference to the accompanying drawings.

Figure 2:
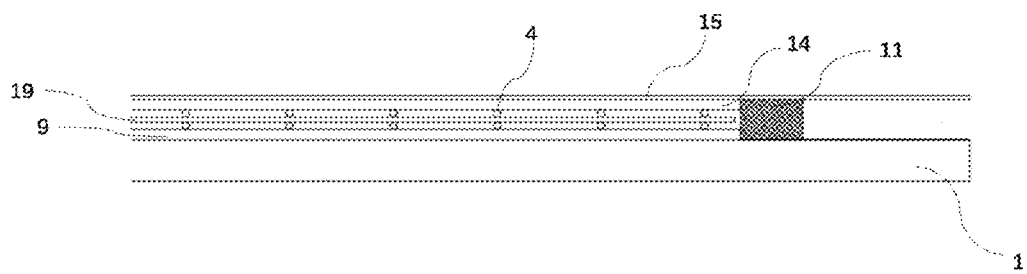
FIG. 2 is a schematic diagram of Example 1 of the manufacturing method of a solar cell module.
Figure 3:
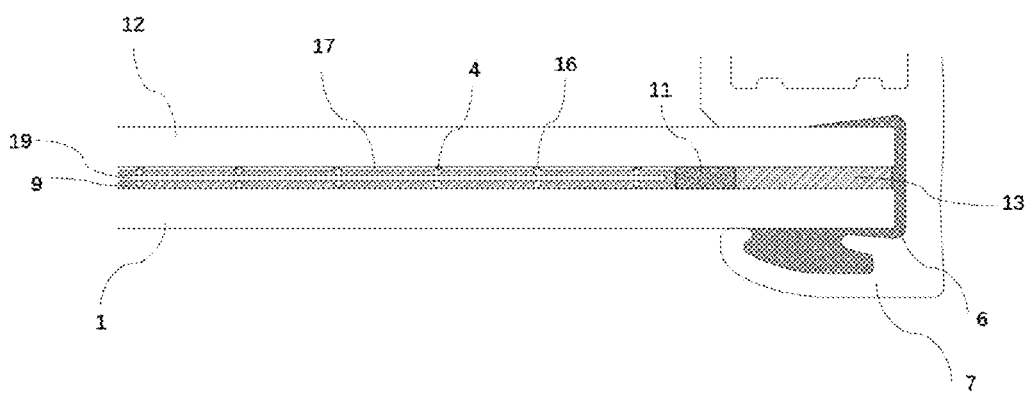
FIG. 3 is another schematic diagram of Example 1 of the manufacturing method of a solar cell module.

Example 1: An exemplary manufacturing method of a solar cell module is as follows:

1) Forming a solar cell string 19 according to the design;

2) Laying a encapsulant material of the front surface, i.e., EVA/POE/EVA co-extruded material 9, and a front plate glass 1 on a surface of the solar cell string;

3) Connecting the solar cell string in series or in parallel according to a circuit requirement using a welding strip or any other conductor, and setting a lead wire;

4) Laying a encapsulant material film of the back surface, i.e., EVA/POE/EVA co-extruded material 14 on another surface of the solar cell string, and laying a first layer of sealing material 11 in a periphery of the co-extruded material 14;

5) Laying an isolating material tetrafluorocloth 15 on a back surface of the co-extruded material 14, and inspecting and testing to obtain the module as shown in FIG. 2;

6) Entering the laminator for lamination to form a laminate member; wherein, a lamination process may be: a lamination temperature is 145° C., vacuuming is carried out for 8 minutes to achieve a vacuum degree of less than 0.5 mbar, and a lamination time is 10 minutes; the lamination process may adopt a stepwise lamination; a pressure for the first lamination may be 0 to 300 mbar, and a pressure for the second lamination may be 300 to 1000 mbar; by appropriately reducing the lamination pressure, a hidden crack rate can be reduced;

7) Performing trimming inspection, removing an upper isolating material tetrafluorocloth 15, and applying an EVA material 16 of the back surface over a circular welding strip and in a periphery of the module by using a hot melting gun;

8) Covering a back plate glass 12 in a weak reactive gas atmosphere, such as nitrogen 17, and curing the EVA material 16 of the back surface by using a light;

For example, the operation of covering the back plate glass 12 may be performed in a low-humidity and high-concentration nitrogen box; or, while covering the back plate glass 12, low-humidity and high-concentration nitrogen may be used to purge the module until the glass covering is completed;

9) Installing a desiccant 13 in a periphery of the laminate member;

10) Applying a sealant 6, installing a frame 7 and a junction box 8 and carrying out other subsequent steps to form the solar cell module as shown in FIG. 3.

Figure 4:
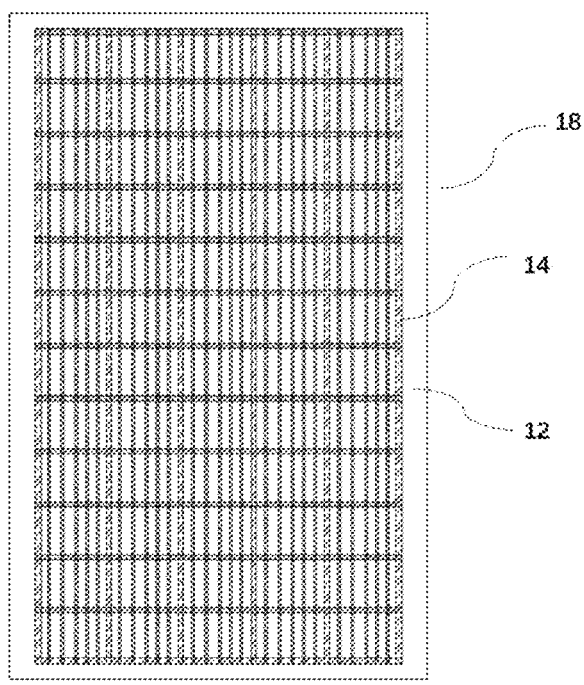
FIG. 4 is a schematic diagram of Example 2 of the manufacturing method of a solar cell module.

Example 2: Another exemplary manufacturing method of a solar cell module is as follows:
1) Forming a solar cell string according to the design;
2) Laying a encapsulant material of the front surface, i.e., EVA/POE/EVA co-extruded material 9, and a front plate glass 1 on a surface of the solar cell string;
3) Connecting the solar cell string in series or in parallel according to a circuit requirement using a welding strip or any other conductor, and setting a lead wire;
4) Laying a encapsulant material of the back surface, i.e., EVA/POE/EVA co-extruded material 14 on another surface of the solar cell string, and laying a first layer of sealing material 11 in a periphery of the co-extruded material 14;
5) Covering a combined material 18 of the encapsulant material of the back surface, i.e., an EVA material 14, and the back plate glass 12; as shown in FIG. 4, in this example, the EVA material 14 corresponds to the welding strip of the solar cell string, the gap between the solar cells, and the periphery of the solar cell string;
6) Inspecting and testing;
7) Entering the laminator for lamination to form a laminate member;
8) Performing trimming inspection, and installing a desiccant 13 in a periphery of the laminate member;
9) Applying a sealant 6, installing a frame 7 and a junction box and carrying out other subsequent steps to form the solar cell module.

It should be noted that the process of applying the encapsulant material twice in the present disclosure is also applicable to the front surface of the solar cell string. When used for the front surface, it is the same as the process used for the back surface, which will not be described here for brevity.

An embodiment of the present disclosure further provides a solar cell module, which is manufactured by any of the manufacturing methods described above.

Please refer to FIG. 3 for an exemplary schematic diagram of the solar cell module. For its description, reference may be made to the above relevant description of the solar cell module, which will not be repeated here.

The solar cell module and a manufacturing method thereof provided by the embodiments of the present disclosure have the following beneficial effects:
1. The process of applying encapsulant material twice is adopted on the solar cell string, for example, the encapsulant material is applied to the back surface, the front surface, or the back surface and the front surface, and at a second time of applying encapsulant material, the encapsulant material is only applied to a local region at least corresponding to the welding strip, thereby reducing a total amount of encapsulant material used, and reducing the distance between the back plate material and the solar cell string and/or between the front plate material and the solar cell string;
2. Without reducing a diameter of a currently used circular welding strip while ensuring a sufficient yield strength of the welding strip and a small battery power loss, it can be ensured that a encapsulant film in the solar cell module can wrap the back surface of the welding strip away from the solar cell, so as to fully protect the welding strip, and better bond the back plate material and the solar cell;
3. By applying the encapsulant material twice, it can be ensured that there is an adhesive encapsulant material between the welding strip and the back plate and/or the front plate, so that the back plate and/or the front plate can be better bonded with the solar cell string, to improve the stability of the solar cell module;
4. At the second time, the encapsulant material may also be applied to the gap between the solar cells and the periphery of the solar cell string, so that the front plate and the back plate can be better bonded with the solar cells, to improve the stability of the solar cell module;
5. Double-layer sealing is used for the solar cell module, and a desiccant is added between the double-layer sealed, thereby further preventing water vapor from infiltrating from around the module to damage the solar cell module, and improving the stability and performance of the solar cell module.

A technical solution 1. a manufacturing method of a solar cell module comprises: providing a solar cell string; arranging a plurality of welding strips on a back surface of the solar cell string; arranging a first encapsulant material on a back surface of the welding strip, to form a first encapsulant material layer; on the back surface of the solar cell string on which the first encapsulant material layer is formed, arranging a second encapsulant material in a local region corresponding to at least one welding strip, to form a second encapsulant material layer; and laminating to form a laminate member.

A technical solution 2. in the manufacturing method according to the technical solution 1, on the back surface of the solar cell string on which the first encapsulant material layer is formed, arranging a second encapsulant material in a local region corresponding to at least one welding strip, comprises: applying the second encapsulant material directly in the local region, to form the second encapsulant material layer.

A technical solution 3. in the manufacturing method according to the technical solution 1, on the back surface of the solar cell string on which the first encapsulant material layer is formed, arranging a second encapsulant material in a local region corresponding to at least one welding strip, comprises: arranging the second encapsulant material in a region corresponding to the at least one welding strip on a surface of a back plate material; and arranging the back plate material on the first encapsulant material layer, wherein, the second encapsulant material faces the first encapsulant material layer, and the second encapsulant material corresponds to the at least one welding strip, and the laminating to form a laminate member is performed after arranging the back plate material on the first encapsulant material layer.

A technical solution 4. in the manufacturing method according to the technical solution 2, before applying the second encapsulant material directly in the local region, to form the second encapsulant material layer, the manufacturing method further comprises: arranging a flexible isolating material on the first encapsulant material layer; after arranging the flexible isolating material, performing a step of: laminating to form a laminate member; and removing the flexible isolating material.

A technical solution 5. in the manufacturing method according to the technical solution 4, after applying the second encapsulant material directly in the local region, to form the second encapsulant material layer, the manufacturing method further comprises: covering the back surface of the solar cell string with the back plate material in a weak reactive gas atmosphere; and curing the second encapsulant material, and the weak reactive gas is a gas whose activity is weaker than activity of air.

A technical solution 6. in the manufacturing method according to the technical solution 2, applying the second encapsulant material directly in the local region, to form the second encapsulant material layer, comprises: applying the second encapsulant material directly over the at least one welding strip using a hot melting gun; or applying a strip-shaped second encapsulant material over the at least one welding strip.

A technical solution 7. in the manufacturing method according to any one of the technical solutions 1 to 6, after arranging a first encapsulant material on a back surface of the welding strip, to form a first encapsulant material layer, the manufacturing method further comprises: arranging a first layer of sealing material in a periphery of the first encapsulant material layer.

A technical solution 8. in the manufacturing method according to any one of the technical solutions 1 to 6, the solar cell string comprises a plurality of solar cells, and at a same time of, on the back surface of the solar cell string on which the first encapsulant material layer is formed, arranging a second encapsulant material in a local region corresponding to at least one welding strip, the manufacturing method further comprises: arranging the second encapsulant material on the back surface of the solar cell string and in a region corresponding to a gap between the solar cells and/or a periphery of the solar cell string.

A technical solution 9. the manufacturing method according to any one of the technical solutions 1 to 6, further comprises: arranging a third encapsulant material and a front plate material on a front surface of the solar cell string; arranging a desiccant in a periphery of the laminate member; applying a sealant in a periphery of the desiccant; and installing a frame, to form the solar cell module.

A technical solution 10. in the manufacturing method according to the technical solution 3, arranging the second encapsulant material in a region corresponding to the at least one welding strip on a surface of a back plate material, comprises: applying the second encapsulant material in the region corresponding to the at least one welding strip on the surface of the back plate material using a hot melting gun; or applying a strip-shaped second encapsulant material in the region corresponding to the at least one welding strip on the surface of the back plate material.

A technical solution 11. in the manufacturing method according to any one of the technical solutions 1 to 6, the first encapsulant material is different from the second encapsulant material.

A technical solution 12. in the manufacturing method according to the technical solution 11, the first encapsulant material comprises one or more of ethylene-vinyl acetate copolymer (EVA), polyolefin elastomer (POE) and polyvinyl butyral (PVB); the second encapsulant material comprises high reflectivity silicone, or one or more of ethylene-vinyl acetate copolymer (EVA), polyolefin elastomer (POE) and polyvinyl butyral (PVB).

A technical solution 13. in the manufacturing method according to the technical solution 12, the first encapsulant material comprises a co-extruded material (EPE) of ethylene-vinyl acetate copolymer, polyolefin elastomer, and ethylene-vinyl acetate copolymer.

A technical solution 14. in the manufacturing method according to the technical solution 5, the weak reactive gas is nitrogen.

A technical solution 15. in the manufacturing method according to the technical solution 5, covering the back surface of the solar cell string with the back plate material in a weak reactive gas atmosphere, comprises: covering the back surface of the solar cell by using the back plate material in a low-humidity and high-concentration nitrogen box; or purging with low-humidity and high-concentration nitrogen while covering the back surface of the solar cell by using the back plate material.

A technical solution 16. in the manufacturing method according to the technical solution 15, a humidity of the nitrogen is 100 ppm or less, and a concentration of the nitrogen is 98% or more.

A technical solution 17. in the manufacturing method according to any one of the technical solutions 1 to 6, laminating to form a laminate member, comprises: performing a stepwise lamination in the laminator, to form the laminate member, wherein a lamination temperature is 145° C., a lamination vacuum degree is less than 0.5 mbar, and a lamination time is 10 minutes.

A technical solution 18. in the manufacturing method according to the technical solution 17, performing a stepwise lamination in the laminator, to form the laminate member, comprises: performing a first lamination under a pressure of 0 to 300 mbar, a lamination time of the first lamination being 1 to 2 minutes; and performing a second lamination under a pressure of 300 to 1000 mbar, a lamination time of the second lamination being 8 to 9 minutes.

A technical solution 19. in the manufacturing method according to the technical solution 4, the flexible isolating material comprises a material that is not adhered to the first encapsulant material.

A technical solution 20. in the manufacturing method according to the technical solution 19, the flexible isolating material comprises tetrafluorocloth or release paper A technical solution 21. A solar cell module, manufactured by using the manufacturing method according to any one of technical solutions 1 to 19.

What are described above is related to the specific embodiments of the disclosure only and not limitative to the scope of the disclosure. The protection scope of the disclosure shall be based on the protection scope of the claims. Any modification and equivalent replacement may be made by those skilled in the art within the substantial protection scope of the embodiments of the present disclosure, which is regarded as falling within the protection scope of embodiments of the present disclosure.

The invention claimed is:
1. A manufacturing method of a solar cell module, comprising:
   providing a plurality of solar cells;
   arranging a plurality of welding strips on a back surface of the plurality of solar cells, and welding the plurality of welding strips to the plurality of solar cells to form a solar cell string, wherein the solar cell string comprises the plurality of solar cells;
   arranging a first encapsulant material on a back surface of the plurality of welding strips, to form a first encapsulant material layer;
   laminating to form a laminate member by applying a pressure,
   after the laminating to form the laminate member, on a back surface of the first encapsulant material layer, arranging a second encapsulant material in a local region corresponding to at least one of the plurality of welding strips, to form a second encapsulant material layer; and
   wherein on a back surface of the first encapsulant material layer, arranging a second encapsulant material in a local region corresponding to at least one of the plurality of welding strips, to form a second encapsulant material layer, comprises:

applying the second encapsulant material directly in the local region, to form the second encapsulant material layer, wherein before applying the second encapsulant material directly in the local region, to form the second encapsulant material layer and laminating to form a laminate member by applying the pressure, the manufacturing method further comprises:

arranging a flexible isolating material on the first encapsulant material layer;

after arranging the flexible isolating material, performing a step of: the laminating to form the laminate member; and removing the flexible isolating material, wherein after applying the second encapsulant material directly in the local region, to form the second encapsulant material layer, the manufacturing method further comprises:

covering the back surface of the solar cell string with a back plate material in a weak reactive gas atmosphere; and curing the second encapsulant material by performing light curing, thermal curing or chemical curing to the second encapsulant material layer without a process of applying pressure to the second encapsulant material layer, wherein the weak reactive gas is a gas whose activity is weaker than activity of air.

2. The manufacturing method according to claim 1, wherein applying the second encapsulant material directly in the local region, to form the second encapsulant material layer, comprises:

applying the second encapsulant material directly over the at least one welding strip using a hot melting gun; or applying a strip-shaped second encapsulant material over the at least one welding strip.

3. The manufacturing method according to claim 1, wherein after arranging a first encapsulant material on a back surface of the plurality of welding strips, to form a first encapsulant material layer, the manufacturing method further comprises:

arranging a first layer of sealing material in a periphery of the first encapsulant material layer.

4. The manufacturing method according to claim 1, wherein at a same time of, on the back surface of the first encapsulant material layer, arranging a second encapsulant material in a local region corresponding to at least one of the plurality of welding strips, the manufacturing method further comprises:

arranging the second encapsulant material on back surface of the first encapsulant material layer and in a region corresponding to a gap between the solar cells and/or a periphery of the solar cell string.

5. The manufacturing method according to claim 1, further comprising:

arranging a third encapsulant material and a front plate material on a front surface of the solar cell string;

arranging a desiccant in a periphery of the laminate member;

applying a sealant in a periphery of the desiccant; and installing a frame, to form the solar cell module.

6. The manufacturing method according to claim 1, wherein the first encapsulant material is different from the second encapsulant material.

7. The manufacturing method according to claim 6, wherein the first encapsulant material comprises one or more of ethylene-vinyl acetate copolymer (EVA), polyolefin elastomer (POE) and polyvinyl butyral (PVB); the second encapsulant material comprises high reflectivity silicone, or one or more of ethylene-vinyl acetate copolymer (EVA), polyolefin elastomer (POE) and polyvinyl butyral (PVB).

8. The manufacturing method according to claim 7, wherein the first encapsulant material comprises a co-extruded material (EPE) of ethylene-vinyl acetate copolymer, polyolefin elastomer, and ethylene-vinyl acetate copolymer.

9. The manufacturing method according to claim 1, wherein the weak reactive gas is nitrogen.

10. The manufacturing method according to claim 1, wherein covering the back surface of the solar cell string with the back plate material in a weak reactive gas atmosphere, comprises:

covering the back surface of the solar cell string by using the back plate material in a low-humidity and high-concentration nitrogen box; or purging with low-humidity and high-concentration nitrogen while covering the back surface of the solar cell string by using the back plate material.

11. The manufacturing method according to claim 10, wherein a humidity of the nitrogen is 100 ppm or less, and a concentration of the nitrogen is 98% or more.

12. The manufacturing method according to claim 1, wherein laminating to form a laminate member, comprises:

performing a stepwise lamination in the laminator, to form the laminate member, wherein a lamination temperature is 145° C., a lamination vacuum degree is less than 0.5 mbar, and a lamination time is 10 minutes.

13. The manufacturing method according to claim 12, wherein performing a stepwise lamination in the laminator, to form the laminate member, comprises:

performing a first lamination under a pressure of 0 to 300 mbar, a lamination time of the first lamination being 1 to 2 minutes; and performing a second lamination under a pressure of 300 to 1000 mbar, a lamination time of the second lamination being 8 to 9 minutes.

14. The manufacturing method according to claim 4, wherein the flexible isolating material comprises a material that is not adhered to the first encapsulant material, and the flexible isolating material comprises tetrafluorocloth or release paper.

15. A solar cell module, manufactured by using the manufacturing method according to claim 1.

* * * * *